United States Patent [19]

Itoh

[11] Patent Number: 4,667,166
[45] Date of Patent: May 19, 1987

[54] DIFFERENTIAL AMPLIFIER SYSTEM
[75] Inventor: Yasuhiro Itoh, Tokyo, Japan
[73] Assignee: Iwatsu Electric Co., Ltd., Tokyo, Japan
[21] Appl. No.: 820,210
[22] Filed: Jan. 17, 1986
[30] Foreign Application Priority Data
Jan. 28, 1985 [JP] Japan .................................. 60-14009
[51] Int. Cl.$^4$ .............................................. H03F 3/45
[52] U.S. Cl. .................................... 330/260; 330/259; 330/311
[58] Field of Search ............... 330/252, 256, 259, 260, 330/294, 311, 69

[56] References Cited
U.S. PATENT DOCUMENTS
4,366,446 12/1982 Henderson et al. ................. 330/260

Primary Examiner—James B. Mullins
Attorney, Agent, or Firm—Woodcock Washburn Kurtz Mackiewicz & Norris

[57] ABSTRACT

A differential amplifier system comprising a pair of transistors having their collectors connected respectively to a pair of system output terminals, their bases connected respectively to a pair of system input terminals via a pair of capacitors, and their emitters interconnected via a resistor. Also included are a pair of differential amplifiers each having a first input connected to one input terminal, a second input connected to the emitter of one transistor, and an output connected to the base of one transistor. The pair of differential amplifiers are effective to cause, in their operating range of frequencies, negative feedback such that the emitter voltages of the pair of transistors become equal to the input signal voltages. Higher frequencies are directed to the bases of the transistors via the capacitors.

5 Claims, 6 Drawing Figures

DIFFERENTIAL AMPLIFIER SYSTEM

BACKGROUND OF THE INVENTION

My invention relates to electric amplifiers in general and, in particular, to a differential amplifier system for providing an output proportional to the difference between the voltages applied to its two inputs. More particularly, my invention concerns such a differential amplifier system of the class particularly well suited for use in the deflection circuits of oscilloscopes, among other applications.

A typical conventional differential amplifier system (shown in FIG. 1 of the drawings attached hereto) has been of such construction that the output current magnitude varies nonlinearly with the inputs, resulting in output distorsion. The output has also been subject to distortion or drift, particularly when the input is of low frequencies, due to changes in the base emitter junction temperatures of the transistors in use.

I am aware of a more advanced differential amplifier system (FIG. 2) free from such drawbacks of the more conventional one. However, the collector to base voltages of the transistors used in this second prior art system fluctuates considerably in a low frequency range. Therefore, if a high frequency signal being amplified has zero or low frequency components superimposed thereon, the frequency characteristic is subject to change with the magnitude of the superimposed signal components. Further the second prior art system has had problems in amplifying as wide a range of frequencies as can be desired. I will later describe the problems attendant on the noted conventional systems in further detail.

SUMMARY OF THE INVENTION

I have hereby invented an improved differential amplifier system which is practically free from output drift and distortion and which lends itself to the amplification of a wider range of frequencies than the prior art.

Briefly, the improved differential amplifier system of our invention comprises input means having first and second input terminals for receiving first and second input signals respectively, and output means having first and second output terminals for providing an output signal proportional to the difference between the first and second input signals. A first transistor has a collector connected to the first output terminal, and a second transistor has a collector connected to the second output terminal. A first capacitor is connected between the first input terminal and the base of the first transistor, and a second capacitor is connected between the second input terminal and the base of the second transistor. A resistor is connected between the emitters of the first and second transistors. Also included are two differential amplifiers, with the first differential amplifier having a first input connected to the first input terminal, a second input connected to the emitter of the first transistor, and an output connected to the base of the first transistor. The second differential amplifier has a first input connected to the second input terminal, a second input connected to the emitter of the second transistor, and an output connected to the base of the second transistor.

The two differential amplifiers function in their preassigned frequency range to cause negative feedback such that the emitter voltages of the first and second transistors become equal to the input signal voltages. Higher frequencies are directed to the bases of the first and second transistors via the first and second capacitors respectively. This improved system makes it unnecessary to pay design considerations for the thermal coupling of the two transistors. A greater latitude thus allowed for the arrangement of the constituent parts leads to the ease of designing a wider band differential amplifier system than heretofore.

My invention further features means for dividing the input voltages applied to the differential amplifiers, or for dividing the emitter voltages of the transistors fed back to the differential amplifiers. The voltage divider means are effective not only to reduce the ranges of input voltages that must be handled by the differential amplifiers, but also to lessen the adverse effects of the stray capacitances of the inputs of the differential amplifiers.

The above and other features and advantages of my invention and the manner of realizing them will become more apparent, and the invention itself will best be understood, from a study of the following description and appended claims, with reference had to the attached drawings showing the noted prior art devices and the embodiments of our invention.

DETAILED DESCRIPTION

Figure 1:
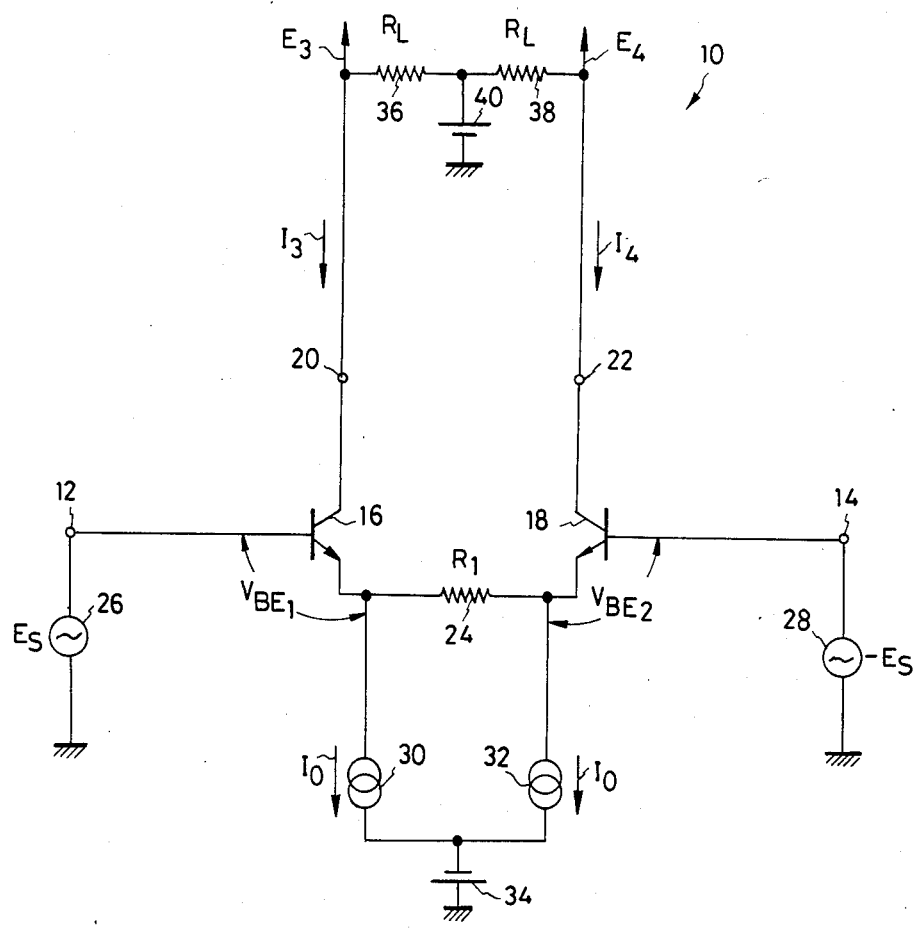
FIG. 1 is a schematic electrical diagram of a prior art differential amplifier system.

I will discuss in some more detail the typical prior art differential amplifier systems and the problems attendant thereon, the better to make clear the features and advantages of my invention. In FIG. 1 I have shown one such known differential amplifier system 10, having first 12 and second 14 input terminals for receiving respective input signals. These input terminals are connected respectively to the bases of first 16 and second 18 transistors. Connected respectively to the collectors of the transistors 16 and 18, a pair of output terminals 20 and 22 provides an output signal proportional to the difference between the two input signals. A resister 24 is connected between the emitters of the transistors 16 and 18. The first input terminal 12 is grounded via a first signal source 26 which provides a signal voltage Es. A second signal source 28 is likewise connected between the secnd input terminal 14 and ground to provide a signal voltage −Es. First 30 and second 32 current sources are connected to the emitters of the first 16 and second 18 transistors, respectively, to provide a bias current Io. A voltage source 34 is connected between the two current sources 30 and 32 and the ground. The pair of output terminals 20 and 22, connected to the collectors of the transistors 16 and 18 as aforesaid, are further connected via respective resistors 36 and 38 to a collector biasing power supply 40 and are thence grounded. The power supply 40 provides collector currents I3 and I4, respectively. I understand that the output terminals 20 and 22 are connected to the bases of a pair of transistors, not shown, included in the next amplifier stage.

The following equations are established in this known differential amplifier system:

$$I3 \approx I_o + [2E_s - (V_{BE1} - V_{BE2})]/R1 \quad (1)$$

$$I4 \approx I_o - [2E_s - (V_{BE1} - V_{BE2})]/R1 \quad (2)$$

$$V_{BE1} \approx kT1/q \cdot \ln I3 - K \quad (3)$$

$$V_{BE2} \approx kT2/q \cdot \ln I4 - K \quad (4)$$

where $V_{BE1}$ = the base to emitter voltage of the first transistor 16

$V_{BE2}$ = the base to emitter voltage of the second transistor 18 k = Boltzman's constant

T1 = the base emitter junction temperature of the first transistor 16

T2 = the base emitter junction temperature of the second transistor 18 q = the charge of electrons

K = a constant.

From Equations (1) through (4) the output current (I3−I4) can be defined as $$I3 - I4 = 4E_s/R1 - 2k/qR1 \cdot (T1 \ln I3 - T2 \ln I4). \quad (5)$$

Equation (5) proves that the output current (I3−I4) changes nonlinearly with the input signal Es and so suffers distorsion. It will also be seen that the output current (I3−I4) is a function of the base emitter junction temperatures T1 and T2. Consequently, upon signal impression, the changes in the magnitude of the collector currents I3 and I4 give rise to the following sequence of transition circuit conditions:

1. Changes in the power loss of the transistors 16 and 18.
2. Changes in the self excited heat of the transistors 16 and 18.
3. Changes in the base emitter junction temperatures T1 and T2 of the transistors.

The changes in the junction temperatures lead to those in the collector currents I3 and I4. It takes a very substantial period of time for this series of variations to subside, during which period the problems of drift and signal distortion manifest themselves, particularly if the signal is in a low frequency range from zero upward.

Generally, the collector currents I3 and I4 are supplied from the voltage source 40 via the respective resistors 36 and 38 and are utilized as the variations of the voltages E3 and E4 across the resistors 36 and 38. If the collector to emitter voltages of the transistors 16 and 18 when no signal is being impressed are (RL+R1/2)Io, where RL is the resistance of each of the resistors 36 and 38, the power losses of both transistors can be made equal in their active region. The noted problems can be circumvented as the difference between the base to emitter junction temperatures T1 and T2 is thus eliminated. This solution is unsatisfactory, however, as the ranges of possible values for the resistance of the resistors 36 and 38 and for the collector currents I3 and I4 become smaller. An additional disadvantage is that the signal voltage at the pair of output terminals 20 and 22 is opposite in phase to that at the pair of input terminals 12 and 14, with the consequent reduction of the frequency range due to the Miller effect associated with the collector to base stray capacitances of the transistors 16 and 18.

Figure 2:
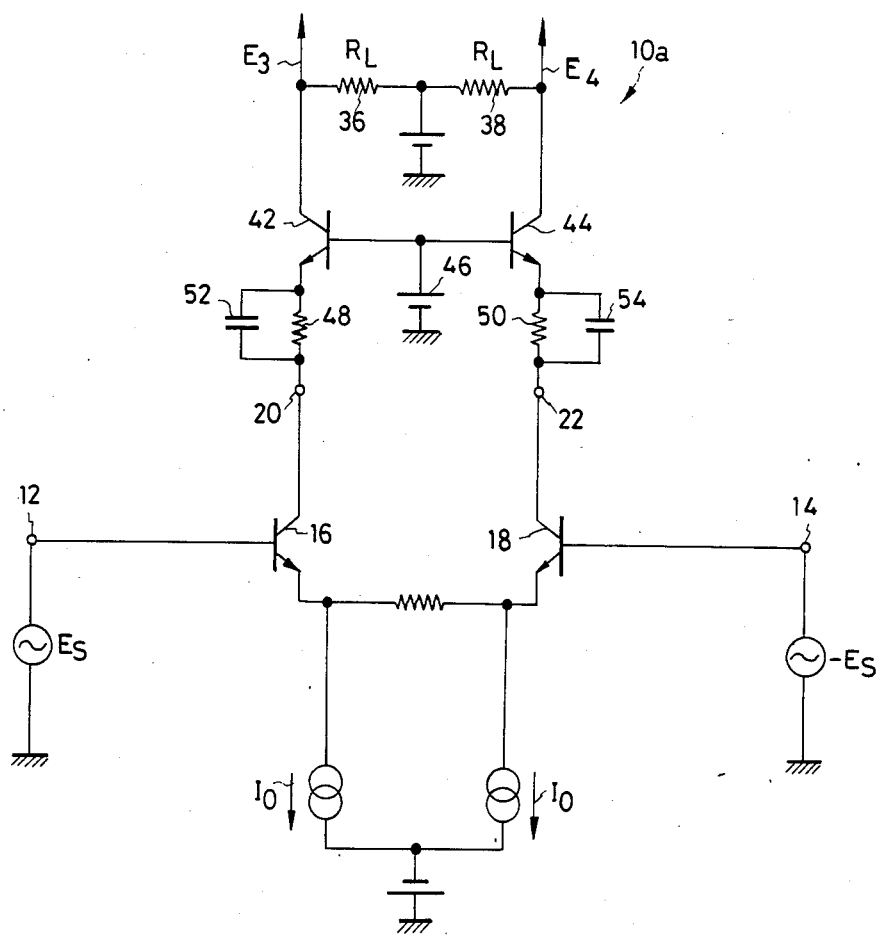
FIG. 2 is a schematic electrical diagram of another prior art differential amplifier system.

I have illustrated in FIG. 2 another conventional differential amplifier system 10a, which is an improvement of the FIG. 1 system 10. This second prior art amplifier system 10a comprises an additional pair of transistors 42 and 44 having their bases gounded via a bias source 46. The emitters of this second pair of transistors 42 and 44 are connected via resistors 48 and 50 to the collectors of the first pair of transistors 16 and 18, respectively, which have their emitters grounded, thereby making up a cascode amplifier. High frequency bypass capacitors 52 and 54 are connected in parallel with the respective resistors 48 and 50.

The FIG. 2 amplifier 10a are identical in the other details of circuit configuration with the FIG. 1 amplifier system 10. I have therefore indicated, where necessary, the various other parts of this amplifier system 10a by the same reference numerals as used to denote the corresponding parts of the amplifier system 10.

This second prior art device 10a offers the advantage that the power losses of the transistors 16 and 18 can be made equal irrespective of the resistive values RL of the resistors 36 and 38 by appropriately setting the values of these resistors and of the additional pair of resistors 48 and 50 as well as the collector to emitter voltages of the transistors 16 and 18. Not only are the drift and distortion problems thus overcome, but also the aforesaid Miller effect becomes less pronounced, and the resistors 36 and 38 can be of any desired values. These advantages combine to enable this conventional system 10a to handle a wider range of frequencies than that of FIG. 1.

Offsetting the above advantages, however, is the fact that the collector to emitter voltages of the transistors 16 and 18 fluctuate considerably in a low frequency range, from zero upward, due to the resistors 48 and 50. Thus, for the amplification of a high frequency signal having direct current or low frequency components superposed thereon, the output frequency characteristic is subject to change with the magnitudes of the superposed signal components. This is a critical defect for amplifiers for oscilloscopic or similar applications where the amplifier outputs must be exact replicas of the inputs. Another weakness of the FIG. 2 prior art is the high frequency losses in the range of several hundred megahertz due to parasitic inductances or stray capacitances because the resistors 48 and 50 and capacitors 52 and 54 are connected to the collectors of the transistors 16 and 18. An extension of the frequency range also becomes difficult by reason of the Miller effect.

An additional drawback of the FIG. 2 circuitry is that it demands design considerations for thermally coupling the transistors 16 and 18 so as to make equal their base emitter junction temperatures in the face of possible temperature changes at limited regions in the vicinities of these transistors. The resulting limitations in the arrangement of the parts have sometimes presented an impediment to the manufacture of wideband amplifiers, althrough this problem is common to both FIGS. 1 and 2 amplifier systems 10 and 10a.

FIRST EMBODIMENT

I will now proceed to the discussion of my invention in terms of several preferable embodiments thereof. Throughout such discussion I will identify parts of the improved differential amplifiers of my invention by the same reference characters as used to denote the corresponding parts, if any, of the prior art devices of FIGS. 1 and 2 and will not describe the connections of such conventional parts to avoid duplication.

Figure 3:
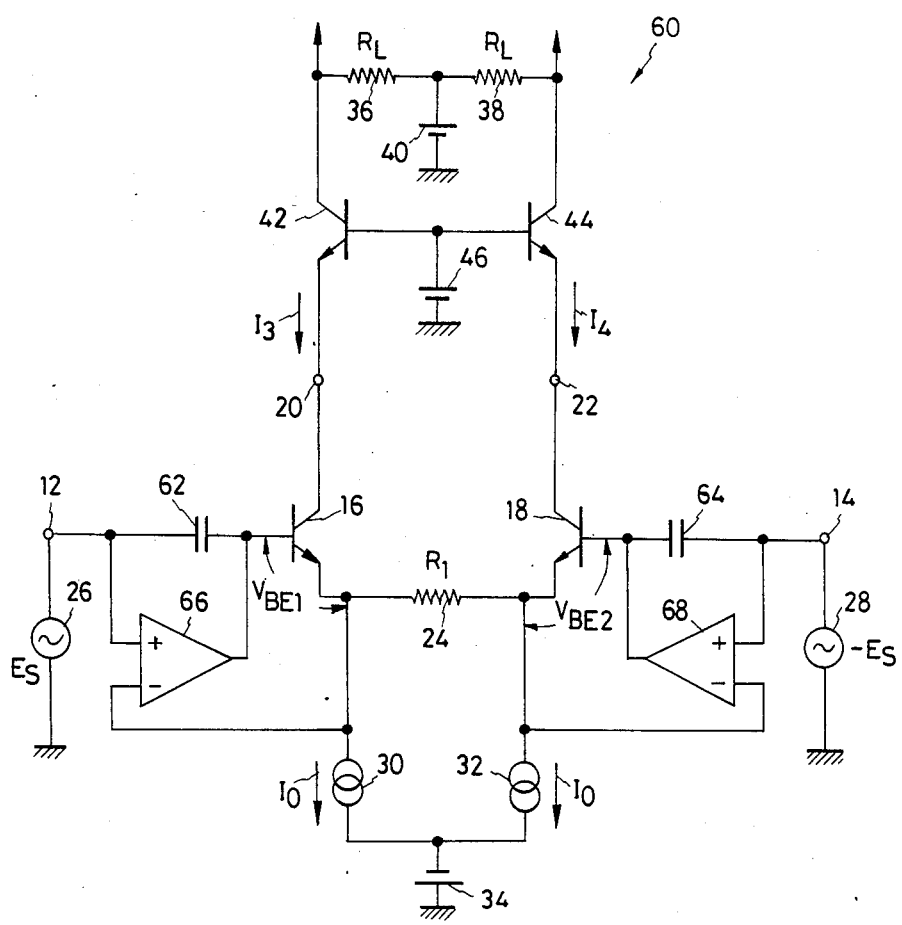
FIG. 3 is a schematic electrical diagram of a preferred form of the differential amplifier system in accordance with my invention.

FIG. 3 illustrates one such differential amplifier system 60 embodying the principles of my invention. This system features first 62 and second 64 capacitors and first 66 and second 68 differential amplifiers. The first capacitor 62 is connected between the first input terminal 12 and the base of the first transistor 16, and the second capacitor 64 between the second input terminal 14 and the base of the second transistor 18. The first differential amplifier 66 has a noninverting input connected to the first input terminal 12, an inverting input connected to the emitter of the first transistor 16, and an output connected to the base of the first transistor 16. The second differential amplifier 68 has a non-inverting input connected to the second input terminal 14, an inverting input connected to the emitter of the second transistor 18, and an output connected to the base of the second transistor 18.

The differential amplifier system 60 further differs from the prior art system 10a of FIG. 2 in not having the resistors 48 and 50 and the capacitors 52 and 54. In all the other respects, however, this system 60 is identical with the prior art system 10a.

Constructed as above, the improved differential amplifier system 60 causes the negative feedback of the output such that the input signal voltage Es on the first input terminal 12 equals the emitter voltage of the first transistor 16, and the input signal voltage $-$Es on the second input terminal 14 equals the emitter voltage of the second transistor 18. The resulting collector currents I3 and I4 of the transistors 16 and 18 can be expressed as:

$$I3 \approx Io + 2Es/R1 \quad (6)$$

$$I4 \approx Io - 2Es/R1 \quad (7)$$

Equations (6) and (7) prove that the collector currents I3 and I4 of the improved system 60 are independent of temperatures but vary in proportion with the input signal voltage Es. Consequently, the output from this system is practically free from drift or distortion.

The capacitors 62 and 64 directly receive input frequencies above the range assigned to the differential amplifiers 66 and 68. Such high frequencies are thence delivered to the bases of the transistors 16 and 18, so that the system 60 functions just like the prior art.

Another advantage of the FIG. 3 system 60 results from the omission of the resistors 48 and 50 and the capacitors 52 and 54 of the FIG. 2 system. Since the noted parasitic inductances and stray capacitances that have been caused by such parts are now absent, the FIG. 3 system suffer far less high frequency losses and a far less reduction of the frequency range due to the Miller effect than that of FIG. 2.

Additionally, less limitations are imposed upon the arrangements of the parts, there being no need for taking into consideration the thermal coupling of the transistors 16 and 18. The omission of the resistors 48 and 50 of the FIG. 2 system also makes it unnecessary to design their resistances for the equal power loss of the transistors 16 and 18. Still further the emitter bias current Io and emitter to collector voltages of the transistors 16 and 18 may be determined as desired. All in all, the improved system of FIG. 3 allows a greater latitude of circuit design.

SECOND EMBODIMENT

Figure 4:
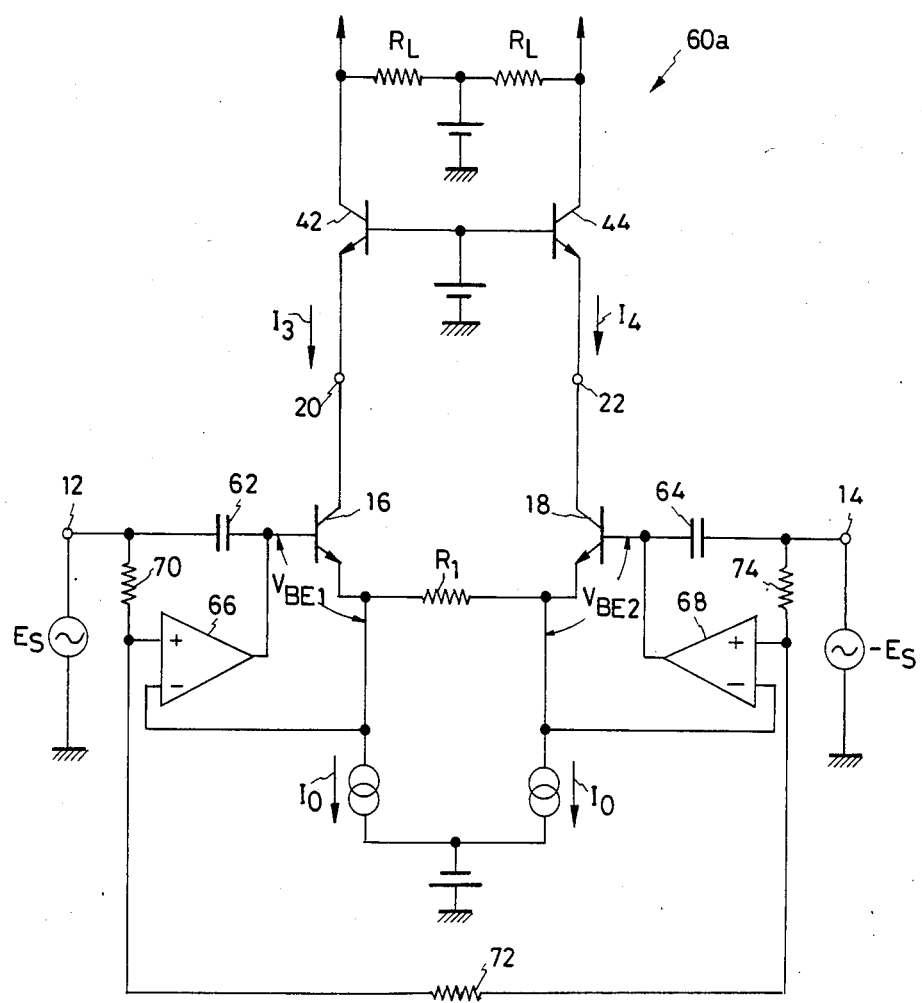
FIG. 4 is a schematic electrical diagram of another preferred form of the differential amplifier system in accordance with my invention.

I will now refer to FIG. 4 for the description of an alternative differential amplifier sytem 60a embodying my invention. This alternative system 60a also comprises the two capacitors 62 and 64 and two differential amplifiers 66 and 68, all connected substantially as in the FIG. 3 system 60. A most distinctive feature of the FIG. 4 system is the voltage dividing network comprising first 70, second 72 and third 74 input dividing resistors. The three resistors 70, 72 and 74 form a series network, connected between the two input terminals 12 and 14. The first differential amplifier 66 has its noninverting input coupled to a point of interconnection between the resistors 70 and 72, and the second differential amplifier 68 has its noninverting input coupled to a point of interconnection between the resistors 72 and 74. This amplifier system 60a is identical in the other details of configuration with the FIG. 3 system 60.

The voltage dividing network of the above construction divides the voltages of the two input signals for application to the respective differential amplifiers 66 and 68. Accordingly, the differential amplifiers 66 and 68 can handle narrower ranges of input voltages. It will also be appreciated that the input dividing resistors 70 and 74 are interposed respectively between the input terminals 12 and 14 and the noninverting inputs of the differential amplifiers 66 and 68. This resistor arrangement is effective to reduce the effects of the stray capacitances of the inputs of the differential amplifiers 66 and 68 on the high frequency signals fed from the input terminals 12 and 14 to the bases of the transistors 16 and 18. It is self evident that this system 60a gains the same advantages as I have set forth in connection with the FIG. 3 system 60.

THIRD EMBODIMENT

Figure 5:
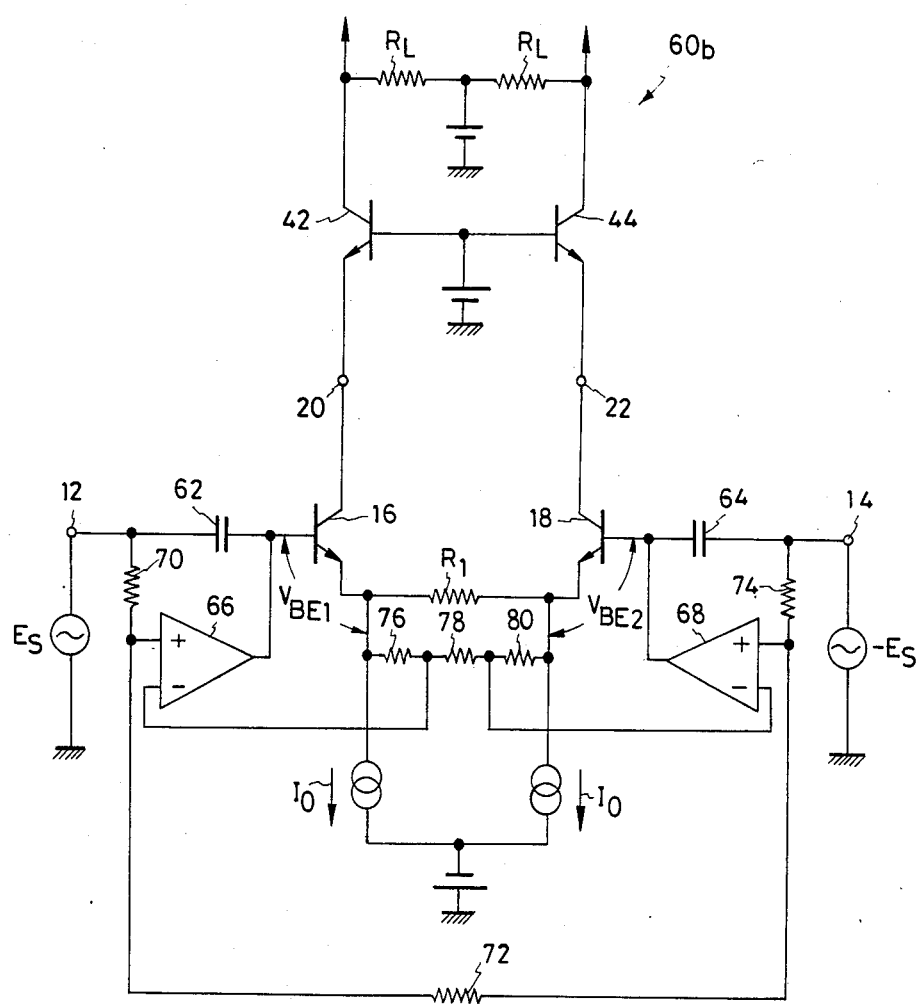
FIG. 5 is a schematic electrical diagram of still another preferred form of the differential amplifier system in accordance with my invention.

FIG. 5 shows a second alternative form of differential amplifier system 60b in accordance with my invention. This system features an emitter voltage dividing network in the form of a serial connection of three resistors 76, 78 and 80, connected between the emitters of the transistors 16 and 18. Further the first differential amplifier 66 has its inverting input connected to a point of interconnection between the resistors 76 and 78. The second differential amplifier 68 has its inverting input connected to a point of interconnection between the resistors 78 and 80. The other details of configuration are as set forth above in conjunction with the FIG. 4 system 60a.

In the operation of the FIG. 5 system 60b, the emitter voltages of the transistors 16 and 18 are divided prior to application to the differential amplifiers 66 and 68, so that these amplifiers are required to handle narrower ranges of input voltages. As an additional advantage, with the resistors 76 and 80 interposed respectively between the emitters of the transistors 16 and 18 and the inverting inputs of the differential amplifiers 66 and 68, the stray capacitiances of the inputs of these amplifiers less affect the high frequency signals. The other advantages have already been pointed out with reference to FIGS. 3 and 4.

FOURTH EMBODIMENT

Figure 6:
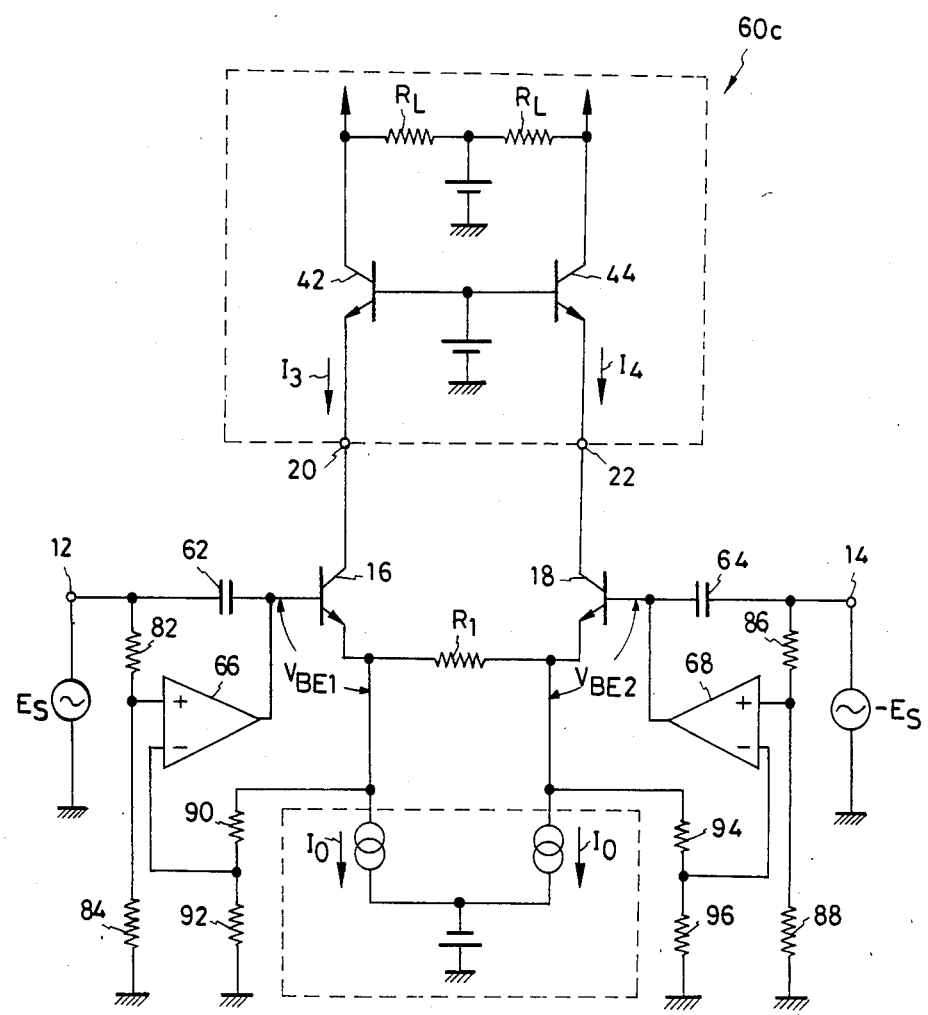
FIG. 6 is a schematic electrical diagram of a further preferred form of the differential amplifier system in accordance with my invention.

In FIG. 6 is shown a further preferred form of differential amplifier system 60c in accordance with my invention. This system newly incorporates a first input voltage dividing network comprising two resistors 82 and 84, and a second input voltage dividing network comprising another two resistors 86 and 88. The resistors 82 and 84 are connected in series between the first input terminal 12 and the ground. A point of interconnection between these resistors 82 and 84 is further connected to the noninverting input of the first differential amplifier 66. The other two resistors 86 and 88 are likewise connected in series between the second input terminal 14 and the ground, with a point of interconnection between the resistors 86 and 88 further connected to the noninverting input of the second differential amplifier 68.

The amplifier system 60c further comprises a first emitter voltage dividing network including two resistors 90 and 92, and a second emitter voltage dividing network including another two resistors 94 and 96. The resistors 90 and 92 are connected in series between the emitter of the first transistor 16 and the ground, and a point of interconnection between these resistors is further connected to the inverting input of the first differential amplifier 66. The other two resistors 94 and 96 are likewise connected in series between the emitter of the second transistor 18 and the ground, and a point of interconnection between these resistors is connected to the inverting input of the second differential amplifier 68. The other details of construction are analogous with those of the FIG. 3 system 60. It will be seen that the this amplifier system 60c gains the same advantages as those described in relation to the FIG. 5 system 60b.

POSSIBLE MODIFICATIONS

I understand that the foregoing detailed discussion of my invention in terms of specific embodiments thereof are by way of example only and not to impose limitations upon my invention. The following is a brief list of possible modifications or alterations of the above disclosed embodiments which, I believe, all fall within the scope of my invention:

1. The resistors 70, 72 and 74 could be eliminated from the differential amplifier system 60b of FIG. 5.

2. The transistors 42 and 44 are not essential components of the amplifier systems 60, 60a, 60b and 60c in accordance with my invention, the inventive concepts being applicable to systems having different output circuits and collector bias means connected to the output terminals 20 and 22.

3. The biasing current sources 30 and 32 and voltage source 34 might take various forms other than those disclosed herein.

4. The signal sources 26 and 28 might be variously constructed and variously connected to the input terminals 12 and 14.

I claim:

1. A differential amplifier system comprising:
   (a) input means comprising first and second input terminals for receiving first and second input signals respectively;
   (b) output means comprising first and second output terminals for providing an output signal proportional to the difference between the first and second input signals;
   (c) a first transistor having a collector connected to the first output terminal;
   (d) a second transistor having a collector connected to the second output terminal;
   (e) a first capacitor connected between the first input terminal and a base of the first transistor;
   (f) a second capacitor connected between the second input terminal and a base of the second transistor;
   (g) a resistor connected between an emitter of the first transistor and an emitter of the second transistor;
   (h) a first differential amplifier having a first input connected to the first input terminal, a second input connected to the emitter of the first transistor, and an output connected to the base of the first transistor; and
   (i) a second differential amplifier having a first input connected to the second input terminal, a second input connected to the emitter of the second transistor, and an output connected to the base of the second transistor.

2. The differential amplifier system of claim 1 further comprising:
   (a) a first input dividing resistor connected between the first input terminal and the first input of the first differential amplifier;
   (b) a second input dividing resistor connected between the first input of the first differential amplifier and the first input of the second differential amplifier; and
   (c) a third input dividing resistor connected between the second input terminal and the first input of the second differential amplifier.

3. The differential amplifier system of claim 1 further comprising:
   (a) a first input dividing resistor connected between the first input terminal and the first input of the first differential amplifier;
   (b) a second input dividing resistor connected between ground and the first input of the first differential amplifier;
   (c) a third input dividing resistor connected between the second input terminal and the first input of the second differential amplifier; and
   (d) a fourth input dividing resistor connected between ground and the first input of the second differential amplifier.

4. The differential amplifier system of claim 1 or 2 further comprising:
   (a) a first emitter voltage dividing resistor connected between the emitter of the first transistor and the second input of the first differential amplifier;
   (b) a second emitter voltage dividing resistor connected between the emitter of the second transistor and the second input of the second differential amplifier; and
   (c) a third emitter voltage dividing resistor connected between the second input of the first differential amplifier and the second input of the second differential amplifier.

5. The differential amplifier system of claim 1 or 3 further comprising:
   (a) a first emitter voltage dividing resistor connected between the emitter of the first transistor and the second input of the first differential amplifier;
   (b) a second emitter voltage dividing resistor connected between ground and the second input of the first differential amplifier;
   (c) a third emitter voltage dividing resistor connected between the emitter of the second transistor and the second input of the second differential amplifier; and
   (d) a fourth emitter voltage dividing resistor connected between ground and the second input of the second differential amplifier.

* * * * *